United States Patent [19]

Giordano

[11] 4,220,873

[45] Sep. 2, 1980

[54] TEMPERATURE COMPENSATED SWITCHING CIRCUIT

[75] Inventor: Raymond L. Giordano, Flemington, N.J.

[73] Assignee: RCA Corporation, New York, N.Y.

[21] Appl. No.: 904,450

[22] Filed: May 9, 1978

[51] Int. Cl.$^2$ ............................................. H03K 17/00
[52] U.S. Cl. ...................................... 307/254; 307/251; 307/310
[58] Field of Search ............ 307/310, 249, 251, 317 A; 357/28, 34

[56] References Cited

U.S. PATENT DOCUMENTS

| | | | |
|---|---|---|---|
| 3,374,361 | 3/1968 | Callis | 307/310 |
| 3,397,326 | 8/1968 | Gallagher et al. | 307/310 |
| 3,686,517 | 8/1972 | Sexton, Jr. | 307/310 |
| 3,867,644 | 2/1975 | Cline | 307/310 |
| 3,899,693 | 8/1975 | Gaudreault | 307/310 |

Primary Examiner—Stanley D. Miller, Jr.
Assistant Examiner—B. P. Davis
Attorney, Agent, or Firm—Paul J. Rasmussen; Allen LeRoy Limberg; John M. O'Meara

[57] ABSTRACT

Temperature compensation is provided in a switching circuit for the saturation voltage drop across a bipolar transistor through which a voltage source is applied to an output terminal. The base current of the bipolar transistor is varied inversely with temperature to hold the saturation voltage drop thereacross substantially constant within the switching circuit. High temperature nonsaturating means for interrupting the base current to the bipolar transistor is combined with this temperature compensation to enhance the turn-on speed of the bipolar transistor in one of the described embodiments. In another embodiment a three state logic circuit (saturated, nonsaturation and nonconductive) is used to interrupt the base current to the bipolar transistor and thereby enhance both the turn on and turn off speed of the bipolar transistor.

10 Claims, 3 Drawing Figures

TEMPERATURE COMPENSATED SWITCHING CIRCUIT

The present invention is directed to a switching circuit for controlling an output level through a bipolar transistor having a substantially constant saturation voltage thereacross as temperature changes. Many approaches are known in the circuitry arts to the general problem of temperature compensation for bipolar transistors. However, all of these approaches suffer from the effects of saturation as temperature rises or voltage breakdown where antisaturation measures are incorporated and therefore, leave something to be desired when utilized in switching circuits.

In the switching circuit of the present invention, an output level is controlled through a bipolar transistor which has the saturation voltage thereacross held substantially constant by means for varying the base current of the bipolar transistor inversely with temperature changes. High temperature nonsaturating means for interrupting the base current to the bipolar transistor may also be included in certain embodiments of the invention to thereby enhance the turn-on speed of the bipolar transistor.

Figure 1:
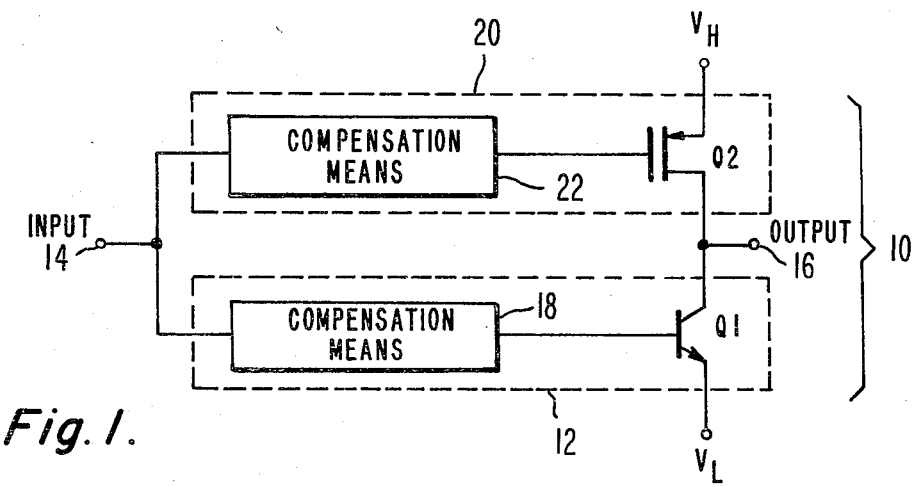
FIG. 1 is a schematic-block diagram of a pulse amplifier having the switching circuit of the invention disclosed therein along with a second switching circuit to respectively control the low and high output levels thereof.

Turning now to the drawings, a pulse amplifier 10 having the switching circuit 12 of this invention incorporated therein is shown in FIG. 1. Amplifier 10 includes an input terminal 14 and an output terminal 16 between which the switching circuit 12 is disposed to control whether terminal 16 receives a low voltage level from a source terminal $V_L$. In the switching circuit 12, the main conduction path of a bipolar transistor $Q_1$ is connected between terminals 16 and $V_L$, while terminal 14 is connected to the base of $Q_1$ through a compensation means 18 for varying the flow of base current into $Q_1$ to hold the saturation voltage thereof substantially constant as temperature changes. It should be understood without further explanation that compensation means 18 and $Q_1$ are thermally coupled to have continuously related temperatures. A second switching circuit 20 is disposed to control whether terminal 16 receives a high voltage level from a source terminal $V_H$. In switching circuit 20, the drain-source conduction path of a MOS/FET transistor $Q_2$ is connected between terminals 16 and $V_H$, while terminal 14 is connected to the gate of $Q_2$ through a compensation means 22 for varying the gate-source voltage of $Q_2$ to hold the drain-source channel resistance thereof substantially constant as temperature changes. As is conventional in pulse amplifiers, a control signal is applied at terminal 14 to render switching circuits 12 and 20 separately conductive to provide either the low or high voltage level at terminal 16. Switching circuit 20 is disclosed and claimed in my copending application (RCA 71,900) that was filed concurrently with this application and is incorporated by reference thereinto.

A load would be connected at terminal 16 and affects the voltage level thereat when either switching circuit 12 or 20 is rendered conductive by the control signal at terminal 14. However, compensation means 18 in switching circuit 12 operates to hold the saturation voltage drop across $Q_1$ substantially constant as temperature changes. Therefore, the current and voltage available for the load at terminal 16 will be substantially constant, if it is assumed that the effect of the load is properly temperature compensated.

Switching circuit 12 is useful in applications other than the pulse amplifer 10 where low drift outputs are important as temperature changes. In applications where the load on the switching circuit 12 is not temperature compensated, the saturation voltage drop across $Q_1$ can be controlled with the compensation means 18 to provide such temperature compensation. Furthermore, a switching circuit similar to switching circuit 12 but with a transistor of complementary conductivity type to that of $Q_1$ could replace switching circuit 20 in the pulse amplifier 10 of FIG. 1.

Figure 2:
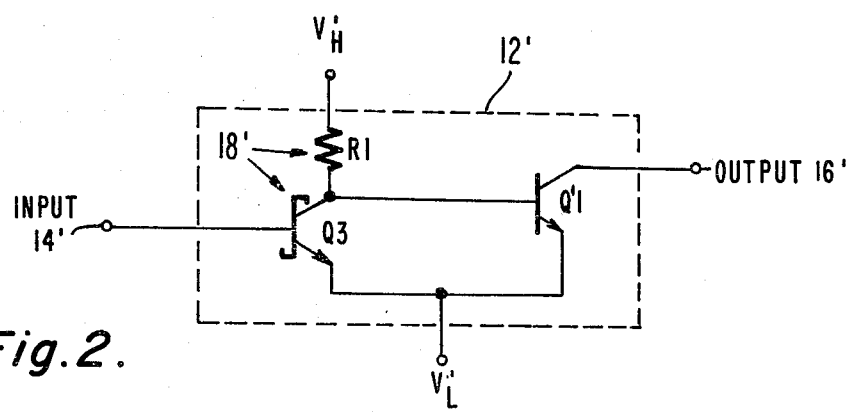
FIG. 2 is a schematic diagram for one circuit embodiment of the invention.

A more specific embodiment of the switching circuit 12' is illustrated in FIG. 2 where a Schottky transistor $Q_3$ and a resistor $R_1$ are disposed in the compensation means 18' thereof. Within $Q_3$, a Schottky barrier diode (not shown separately) is connected between the collector and the base of a bipolar transistor to provide a parallel conduction path across the collector-base junction thereof. When the transistor is conductive, its collector-base junction is clamped at the forward-bias voltage of the diode and therefore, the switching delay caused by saturation of the transistor is minimized. $R_1$ is connected between terminal $V'_H$ and one side of main conduction path through $Q_3$, while terminal $V'_L$ is connected to the other side of the main conduction path through $Q_3$. Terminal 14' is at the base of $Q_3$ and is the signal input for switching circuit 12' at which the control signal is applied. $Q'_1$ is connected with its base to the interconnection between $R_1$ and the main conduction path of $Q_3$, and with its main conduction path between terminal 16' and $V'_L$. The signal output from switching circuit 12' is taken at terminal 16'.

When a low level control signal is applied at terminal 14', $Q_3$ is rendered nonconductive to in turn render $Q'_1$ conductive, and switching circuit 12' operates to apply a voltage at terminal 16'. Because the saturation voltage of $Q'_1$ tends to vary directly with temperature, $R_1$ is selected to have a positive temperature coefficient so that the base current of $Q'_1$ will vary inversely with temperature. Therefore, by scaling the resistance value and the temperature coefficient of $R_1$ in accordance with the saturation voltage temperature coefficient of $Q'_1$, the saturation voltage drop across $Q'_1$ is held substantially constant as temperature changes.

Figure 3:
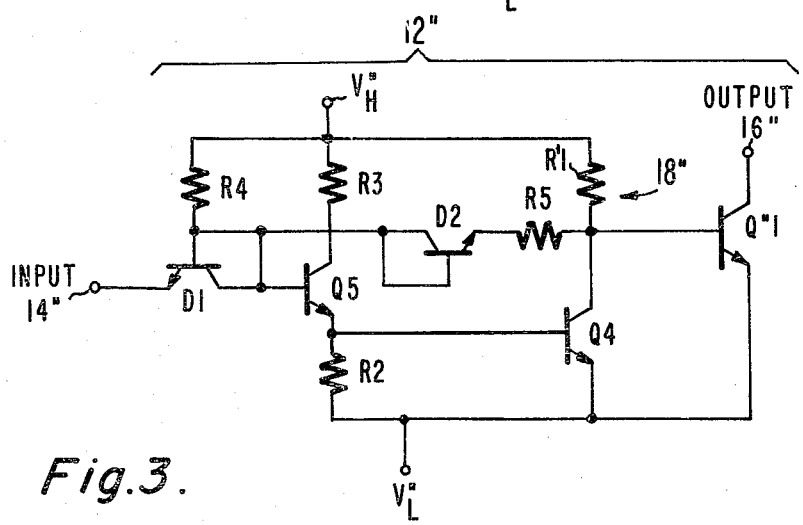
FIG. 3 is a schematic diagram for another circuit embodiment of the invention.

Although the nonsaturation characteristics of the Schottky transistor $Q_3$ in the compensation means 18' of FIG. 2 are quite satisfactory for many applications, in high temperature environments such characteristics deteriorate. Use of the Schottky transistor can be avoided in another embodiment of switching circuit 12" which is illustrated in FIG. 3. In the compensation means 18", $R'_1$ is connected between terminal $V''_H$, and $V''_L$ through the main conduction path of a bipolar transistor $Q_4$. The base of $Q_4$ is connected to terminal $V''_L$ through a resistor $R_2$ and to terminal $V''_H$ through the main conduction path of another bipolar transistor $Q_5$ in series with a resistor $R_3$. The base of $Q_5$ is commonly connected to one electrode of separate diodes D₁ and D₂ which are each derived from one junction of a bipolar transistor having its other junction shunted. This common connection is also connected to terminal V"$_H$ through a resistor R₄. Terminal 14" is at the other electrode of D₁ and is the signal input for switching circuit 12" at which the control signal is applied. The other electrode of D₂ is connected through a resistor R₅ to the interconnection between R'₁ and the main conduction path of Q₄, while Q"₁ is connected with its base to that same interconnection and with its main conduction path between terminals 16" and V"$_L$. The signal output from switching circuit 12" is taken at terminal 16".

When a high level control signal is applied at terminal 14" of sufficient magnitude to reverse bias D₁, the base-emitter junction of Q₅ becomes forward-biased and Q₅ draws base current from V"$_H$ through R₄ to rapidly become conductive. The resistance values of R₂ and R₃ are selected to establish a voltage drop across R₂ of sufficient magnitude to forward-bias the base-emitter junction of Q₄ which also becomes conductive rapidly. The main conduction path of Q₄ then draws current from V"$_H$ through R'₁. Initially Q₄ will go into saturation shunting the base of Q"₁ with a low resistance path to V"$_L$ causing rapid turn off of Q"₁. Thereafter, the voltage on the base of Q"₁ reaches a level sufficient to forward-bias the junction of D₂ relative to the voltage on the base of Q₅, and base current is diverted from Q₅ through R₅ to pull Q₄ out of saturation. The voltage level on the base of Q₅ is above V"$_L$ by a magnitude equal to $V_{BEQ4}+V_{BEQ5}$ so that D₂ remains nonconductive until the voltage on the base of Q"₁ drops below this voltage level by at least the barrier voltage of its junction.

With Q₄, Q₅ and D₂ all conductive, the collector current of Q₄ is drawn from V"$_H$ through R'₁ and through R₅, D₂ and R₄. Consequently, Q₄ is provided with a collector-to-base feedback connection through R₅, D₂ and the emitter-follower action of Q₅ to relate both the base current of Q₅ and the collector current of Q₄ to the voltage drop across R₄. This voltage drop stabilizes at a value equal to V"$_H-(V_{BEQ5}+V_{BEQ4})$. Since Q₄ must rapidly become nonconductive if Q"₁ is to become rapidly conductive, R₅ is sized to hold the voltage on the base of Q"₁ below its $V_{BE}$ level, while holding the collector-emitter voltage across Q₄ above its saturation level. Assuming that the current through R₅ is substantially equal to the current through R₄, and the junction barrier voltage of D₂ and the $V_{BE}$ of Q₄ and Q₅ are substantially identical, such as would be the case in an integrated circuit, this is accomplished in the circuitry of FIG. 3 by making the value of $R_5=R_4 (V_{BE}/2)/(V"_H-2 V_{BE})$.

When a low level control signal is applied at terminal 14" to forward-bias D₁, both the base-emitter junction of Q₅ and the junction of D₂ become reverse-biased. Q₅ is rendered nonconductive to in turn render Q₄ nonconductive, while D₂ is rendered nonconductive to discontinue current flow through R₅. Because Q₄ had previously been in nonsaturated conduction, it turns off rapidly to forward bias the base-emitter junction of Q"₁ which turns on rapidly to draw base current from V"$_H$ through R'₁. Because the saturation voltage of Q"₁ tends to vary directly with temperature, R'₁ is selected to have a positive temperature coefficient so that the base current of Q"₁ will vary inversely with temperature. Therefore, by selecting the value and temperature coefficient for R'₁ in accordance with the saturation voltage temperature coefficient of Q"₁, the saturation voltage drop across Q"₁ is held substantially constant as temperature changes.

Those skilled in the art should understand without further explanation that the high voltage source terminal rather than the low voltage source terminal could have been connected to the output terminal through the switching circuit of the invention in the arrangements of FIGS. 1, 2 and 3. The transistors in such switching circuits would be of the PNP conductivity type, rather than the NPN conductivity type which are shown. Therefore, this invention has been disclosed herein by describing only selected embodiments thereof and it should be understood by those skilled in the art that numerous changes in the details of construction and the combination or arrangement of parts could be made in the described embodiments without departure from the true scope or spirit of the invention. Consequently, the present disclosure should be construed as illustrative rather than limited.

What I claim is:

1. In a switching circuit of the type wherein a voltage source is applied to the output terminal thereof through a first bipolar transistor and a signal at the input terminal thereof controls the conductivity of said first bipolar transistor, the improvement comprising:
compensation means for varying the flow of base current into said first bipolar transistor to hold the saturation voltage thereof substantially constant as temperature changes, including
a Schottky transistor having its base connected to receive the control signal and having its main conduction path connected between said voltage source and a voltage reference through a resistor, the base of said first bipolar transistor being connected to the interconnection between said resistor and the main conduction path of said Schottky transistor, said resistor and the saturation voltage of said first bipolar transistor both having positive temperature coefficients so that the base current of said first bipolar transistor varies inversely with temperature to result in substantially constant saturation voltage thereacross as temperature changes.

2. In a switching circuit of the type wherein a voltage source is applied to the output terminal thereof through a first bipolar transistor and a signal at the input terminal thereof controls the conductivity of said first bipolar transistor, the improvement comprising:
compensation means for varying the flow of the base current into said first bipolar transistor to hold the saturation voltage thereof substantially constant as temperature changes, including
second and third bipolar transistors, first and second diodes, and first, second, third, fourth and fifth resistors;
the main conduction path of said second transistor having one side thereof connected to a reference voltage through said first resistor, and having the other side thereof connected both to the base of said third transistor and to said voltage source through said second resistor;
the main conduction path of said third transistor having one side thereof connected to the voltage source and the other side thereof connected separately to one terminal of said first diode through said third resistor and to said reference voltage through said fourth resistor;

the other electrode of said first diode being commonly connected to one electrode of said second diode, to the base of said second transistor, and to said reference voltage through said fifth resistor;

said first and second diodes each being poled to conduct current away from the base of said second transistor;

the input terminal of the switching circuit being the other electrode of said second diode and the base of said first bipolar transistor being connected at the interconnection of said third resistor with the main conduction path of said third transistor;

said fourth resistor and the saturation voltage of said first transistor both having positive temperature coefficients so that the base current of said first bipolar transistor varies inversely with temperature to result in a substantially constant saturation voltage thereacross as temperature changes; and said second diode being rendered nonconductive by the input signal to render said second and third transistors and said first diode conductive, said third transistor becoming conductive in saturation before said first diode becomes conductive to render said first bipolar transistor rapidly nonconductive and said third and fifth resistors being selected to hold the quiescent collector-emitter voltage of said third transistor at a level to preclude saturated operation thereof when said first diode becomes conductive so that said first bipolar transistor may become rapidly conductive when said second diode is rendered conductive by the input signal thereafter.

3. The switching circuit of claim 2 wherein a P-N junction in fourth and fifth bipolar transistors are respectively connected as said first and second diodes.

4. The switching circuit of claim 3 wherein the voltage source is of a low level and all of said bipolar transistors are NPN types having substantially the same base-emitter voltage characteristic, said P-N junctions in said fourth and fifth transistors being the base-emitter junctions thereof while collector-base junction thereof is shunted, said substantially constant collector-emitter voltage of said third transistor being fixed at one-half the common base-emitter voltage characteristic of said bipolar transistors.

5. In a switching circuit of the type wherein a voltage source is applied to the output terminal thereof through a first bipolar transistor and a signal at the input terminal thereof controls the conductivity of said first bipolar transistor, the improvement comprising:

compensation means for varying the flow of base current into said first bipolar transistor to hold the saturation voltage thereof substantially constant as temperature changes, including second and third bipolar transistors of the same conductivity type as said first bipolar transistor, the emitter electrodes of said first and second bipolar transistors being connected to said voltage source, and the collector electrode of said second bipolar transistor being connected to the base electrode of said first bipolar transistor, whereby the emitter-to-collector voltage of said second bipolar transistor is applied as the emitter-to-base voltage of said first bipolar transistor;

means for connecting said third transistor to operate as an emitter-follower with its emitter electrode being connected to the base electrode of said second transistor;

a first resistor connecting the base electrode of said first bipolar transistor to a voltage reference;

a node to which an operating current of appropriate polarity for serving as collector current for said second bipolar transistor is selectively applied, said node being connected to the base electrode of said third bipolar transistor;

means for connecting said node to the collector electrode of said second bipolar transistor at times when said operating current is selectively applied, said means comprising in series connection;

first diode means poled for conducting said selectively applied operating current to the collector of said second bipolar transistor; and means responsive to said selectively applied operating current for providing an offset potential to preserve the switching speed of said second bipolar transistor by rendering the emitter-to-collector voltage thereof insufficiently large for saturated operation, while rendering the emitter-to-base voltage of said first bipolar transistor insufficiently large for conduction therethrough.

6. The switching circuit of claim 6 wherein said node has operating current selectively applied thereto by a second resistor connecting the node to a voltage reference and second diode means connected between said node and a source of control signal voltage.

7. In a switching circuit of the type wherein a voltage source is applied to the output terminal thereof through a first bipolar transistor and a signal at the input terminal thereof controls the conductivity of said first bipolar transistor, the improvement comprising:

resistance means for coupling the base electrode of said first bipolar transistor to a voltage reference, said resistance means having a positive temperature coefficient for varying the base current flow of said first bipolar transistor so that the saturation voltage thereof remains substantially constant as temperature changes;

a second transistor having said signal coupled to its base electrode, and having its main conduction path connected between the base and emitter electrodes of said first bipolar transistor for selectively controlling the conductivity thereof; and means coupled to the collector electrode of said second transistor for holding the potential across the main conduction path thereof above the saturation level when said second transistor is in its conductive state.

8. The switching circuit of claim 7 wherein said means coupled to the collector electrode of said second transistor comprises:

a further transistor in emitter-follower configuration for selectively applying operating current responsive to said signal from the emitter-electrode thereof to the base electrode of said second transistor; and means coupling the base electrode of said further transistor to the collector electrode of said second transistor responsive to said signal for selectively providing an offset potential therebetween.

9. The switching circuit of claim 8 wherein said means coupling the base electrode of said further transistor comprises:

diode junction means poled for conduction for diverting base current from said further transistor for maintaining said second transistor out of saturation.

10. The switching circuit of claim 7 wherein said means coupled to the collector electrode of said second transistor includes Schottky diode means connected across the collector-base junction thereof, said Schottky diode means being poled for providing a parallel conduction path across said collector-base junction.

* * * * *